(12) United States Patent
Shulver et al.

(10) Patent No.: US 10,782,154 B2
(45) Date of Patent: Sep. 22, 2020

(54) TILTED SEGMENTED ANISOTROPIC MAGNETO-RESISTIVE ANGULAR SENSOR

(71) Applicant: Texas Instruments Incorporated, Dallas, TX (US)

(72) Inventors: Byron Jon Roderick Shulver, Murphy, TX (US); Dok Won Lee, Mountain View, CA (US)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 268 days.

(21) Appl. No.: 15/633,516

(22) Filed: Jun. 26, 2017

(65) Prior Publication Data

US 2018/0372511 A1 Dec. 27, 2018

(51) Int. Cl.
*G01D 5/16* (2006.01)
*G01R 33/09* (2006.01)

(52) U.S. Cl.
CPC ............ *G01D 5/16* (2013.01); *G01R 33/096* (2013.01)

(58) Field of Classification Search
USPC .............................. 324/207.21, 252, 207.25
See application file for complete search history.

(56) References Cited

U.S. PATENT DOCUMENTS

| | | | |
|---|---|---|---|
| 3,691,502 A | 9/1972 | Kataoka | |
| 6,011,390 A | 1/2000 | Loreit | |
| 6,201,466 B1 | 3/2001 | Schroeder | |
| 6,633,462 B2 | 10/2003 | Adelerhof | |
| 6,933,717 B1 | 8/2005 | Dogaru | |
| 7,397,236 B2 | 7/2008 | Tatenuma | |
| 7,847,542 B2 | 12/2010 | Bartos | |
| 8,164,332 B2 | 4/2012 | Bartos | |
| 8,947,082 B2 | 2/2015 | Kubik | |

(Continued)

FOREIGN PATENT DOCUMENTS

DE 19701137 7/1998
DE 102016121353 A1 5/2017

(Continued)

OTHER PUBLICATIONS

Patent Cooperation Treaty Search Report, dated Oct. 18, 2018, PCT/US 2018/039570.

*Primary Examiner* — Jay Patidar
(74) *Attorney, Agent, or Firm* — Jacqueline J. Garner; Charles A. Brill; Frank D. Cimino

(57) ABSTRACT

An integrated AMR sensor includes a half bridge with two resistors, a Wheatstone bridge with four resistors, or a first Wheatstone bridge with four resistors in an orthogonal configuration, and a second Wheatstone bridge with four resistors in an orthogonal configuration, oriented at 45 degrees with respect to the first Wheatstone bridge. Each resistor includes first magnetoresistive segments with current flow directions oriented at a first tilt angle with respect to a reference direction of the resistor, and second magnetoresistive segments with current flow directions oriented at a second tilt angle with respect to the reference direction. The tilt angles are selected to advantageously cancel angular errors due to shape anisotropies of the magnetoresistive segments. In another implementation, the disclosed system/method include a method for identifying tilt angles which cancel angular errors due to shape anisotropies of the magnetoresistive segments.

12 Claims, 8 Drawing Sheets

(56) References Cited

U.S. PATENT DOCUMENTS

| | | | |
|---|---|---|---|
| 9,435,662 B2 | 9/2016 | Ausserlechner | |
| 9,470,764 B2 | 10/2016 | Sidman | |
| 2002/0006017 A1* | 1/2002 | Adelerhof | G01D 5/145 360/315 |
| 2004/0137275 A1* | 7/2004 | Jander | B82Y 25/00 428/811.5 |
| 2006/0103381 A1* | 5/2006 | Schmollngruber | B82Y 25/00 324/252 |
| 2011/0187354 A1* | 8/2011 | Zieren | G01D 5/147 324/207.21 |
| 2012/0098533 A1 | 4/2012 | Zimmer | |
| 2013/0099783 A1* | 4/2013 | Kubik | G01R 33/096 324/252 |
| 2015/0002142 A1* | 1/2015 | Kubik | G01D 5/16 324/207.21 |
| 2016/0161574 A1 | 6/2016 | Zimmer | |
| 2016/0313412 A1 | 10/2016 | Li et al. | |

FOREIGN PATENT DOCUMENTS

| | | |
|---|---|---|
| EP | 2769231 A1 | 8/2014 |
| RU | 2307427 C2 | 9/2007 |

\* cited by examiner

TILTED SEGMENTED ANISOTROPIC MAGNETO-RESISTIVE ANGULAR SENSOR

FIELD

This disclosure relates to the field of integrated anisotropic magnetoresistive (AMR) sensors.

BACKGROUND

An anisotropic magnetoresistive (AMR) sensor has magnetoresistive segments which are used to detect an orientation of an external magnetic field. The external magnetic field produces magnetic moments in the magnetoresistive segments. The magnetic moments are not parallel to the external magnetic field, due to shape anisotropies of the magnetoresistive segments, leading to angular errors in estimates of the orientation of the external magnetic field. The shape anisotropies are more pronounced for magnetoresistive segments having elongated shapes, such as long, narrow rectangles, which enable more efficient layouts. The angular errors for sensor having elongated magnetoresistive segments can vary with different orientations of the external magnetic field, ranging higher than 0.1 degrees of error. Conversely, magnetoresistive segments with low shape anisotropy values have low length-to-width ratios, undesirably increasing the area, and hence the cost, of the AMR sensor. Some AMR sensors use curved magnetoresistive segments, to average the angular errors over a range of orientations of the external magnetic fields, resulting in a narrower range of the angular errors, but an undesirably higher average value of the angular errors. Other AMR sensors use a continuous magnetoresistive strip having multiple segments of different sizes and/or orientations to average the angular errors, resulting in the same undesirably higher average value of the angular errors. Angular errors due to shape anisotropies contribute to total errors in the AMR sensors.

SUMMARY

The present disclosure introduces a system comprising an integrated anisotropic magnetoresistive (AMR) sensor and a method for forming an integrated AMR sensor. In one implementation, the disclosed system/method involves an integrated AMR sensor which includes a half bridge with two resistors having reference directions perpendicular to each other. In another implementation, the disclosed system/method involves an integrated AMR sensor which includes a first Wheatstone bridge with four resistors having reference directions in an orthogonal configuration. In a further implementation, the disclosed system/method involves an integrated AMR sensor which includes a first Wheatstone bridge with four resistors having reference directions in an orthogonal configuration, and a second Wheatstone bridge with four resistors having reference directions in an orthogonal configuration, oriented at 45 degrees with respect to the first Wheatstone bridge.

In each implementation, each resistor includes first magnetoresistive segments with first current flow directions oriented at a first tilt angle with respect to the reference direction of the resistor, and second magnetoresistive segments with second current flow directions oriented at a second tilt angle with respect to the reference direction. The first and second tilt angles are selected to advantageously cancel angular errors due to shape anisotropies of the magnetoresistive segments. In another implementation, the disclosed system/method includes a method for identifying tilt angles which cancel angular errors due to shape anisotropies of the magnetoresistive segments.

DETAILED DESCRIPTION

Figure 1:
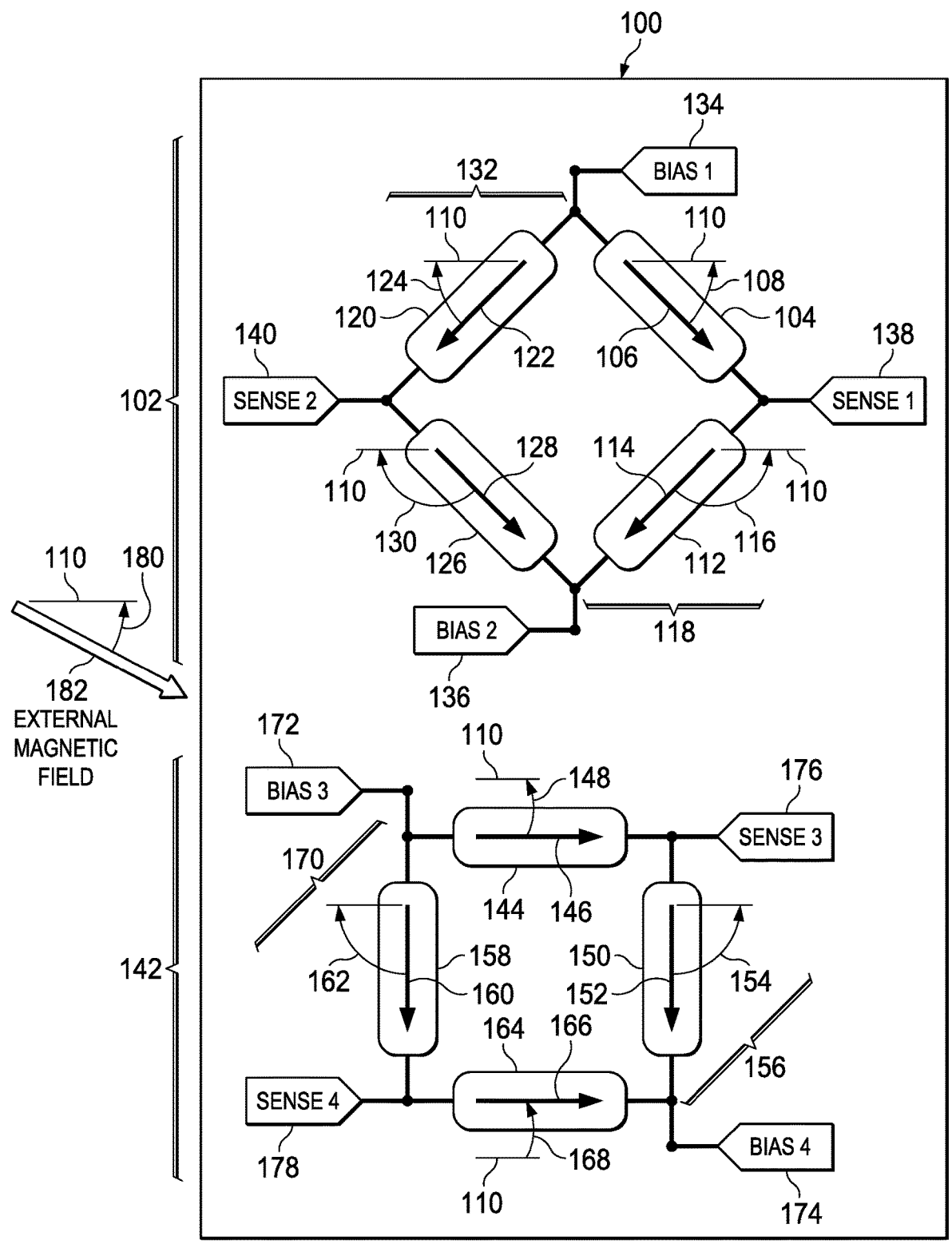
FIG. 1 depicts an example integrated AMR sensor.

The present disclosure is described with reference to the attached figures. The figures are not drawn to scale and they are provided merely to illustrate the disclosure. Several aspects of the disclosure are described below with reference to example applications for illustration. It should be understood that numerous specific details, relationships, and methods are set forth to provide an understanding of the disclosure. Furthermore, not all illustrated acts or events are required to implement a methodology in accordance with the present disclosure.

The present disclosure introduces a system comprising an integrated anisotropic magnetoresistive (AMR) sensor and a method for forming an integrated AMR sensor. In one implementation, the disclosed system/method involves an integrated AMR sensor which includes a half bridge with two resistors having reference directions perpendicular to each other. In another implementation, the disclosed system/method involves an integrated AMR sensor which includes a first Wheatstone bridge with four resistors having reference directions in an orthogonal configuration. In a further implementation, the disclosed system/method involves an integrated AMR sensor which includes a first Wheatstone bridge with four resistors having reference directions in an orthogonal configuration, and a second Wheatstone bridge with four resistors having reference directions in an orthogonal configuration, oriented at 45 degrees with respect to the first Wheatstone bridge.

An integrated AMR sensor may have a half bridge which includes two resistors connected in series, with a sense node between the two resistors. Each resistor has a reference direction that is oriented at a reference angle with respect to a common reference axis of the integrated AMR sensor. The reference directions of the two resistors are perpendicular to each other, that is, in an orthogonal configuration.

Another integrated AMR sensor may have a Wheatstone bridge with four resistors. The four resistors are arranged in two half bridges of two resistor each in series, with sense nodes between the resistors of each half bridge. Each resistor has a reference direction that is oriented at a reference angle with respect to a common reference axis of the integrated AMR sensor. Reference directions of the resistors in each half bridge are perpendicular to each other. The reference direction of each resistor is parallel to the reference direction of one of the resistors in the opposite half bridge, which results in an orthogonal configuration for the Wheatstone bridge.

A further integrated AMR sensor may have a first Wheatstone bridge with four resistors in an orthogonal configuration, and a second Wheatstone bridge with four resistors in an orthogonal configuration, having reference directions oriented at 45 degrees with respect to the reference directions of the first Wheatstone bridge.

In each of the integrated AMR sensors, each resistor includes at least a first magnetoresistive segment and a second magnetoresistive segment electrically coupled in series. The first magnetoresistive segment has a first current flow direction, that is a direction of current flow through the first magnetoresistive segment during operation of the integrated AMR sensor, oriented at a first, positive, tilt angle with respect to the reference direction of the resistor containing the first magnetoresistive segment. The second magnetoresistive segment has a second current flow direction oriented at a second, negative, tilt angle with respect to the reference direction of the resistor.

During operation of the integrated AMR sensors, one or more signals are obtained from the sense nodes. The signals are used to estimate an orientation angle of a component of an external magnetic field in a plane of the magnetoresistive segments. The tilt angles of the magnetoresistive segments in each resistor are selected to advantageously cancel out measurement errors due to shape anisotropies in the estimate of the orientation angle. The magnetoresistive segments may have high length to width ratios, advantageously enabling an efficient layout and thus reducing a cost of the integrated AMR sensor compared to another AMR sensor using magnetoresistive segments with low length to width ratios. In an integrated AMR sensor having only a half bridge, the orientation angle may be estimated over a range of approximately 90 degrees, which may be adequate for some applications. Having only a half bridge may provide a lower area sensor, and hence a lower cost, and lower power consumption compared to other configurations. In an integrated AMR sensor having exactly one Wheatstone bridge, the orientation angle may be estimated over a range of approximately 180 degrees, which may be adequate for other applications. Having exactly one Wheatstone bridge may provide a desired cost and power for those applications, compared to dual Wheatstone bridge configurations. In an integrated AMR sensor having two Wheatstone bridges, the orientation angle may be estimated over a range of 360 degrees.

Examples of specific configurations of integrated AMR sensors are disclosed. A method of selecting tilt angles for magnetoresistive segments to cancel out measurement errors due to shape anisotropies is disclosed as part of a method of forming an integrated AMR sensor.

For the purposes of this disclosure, the term "lateral" is understood to refer to a direction parallel to a plane of an instant top surface of the integrated AMR sensor. The term "vertical" is understood to refer to a direction perpendicular to the plane of the instant top surface of the integrated AMR sensor. Unless otherwise specified, the terms "angular error" and "angular errors" are understood to refer to angular error(s) due to shape anisotropy. For the purposes of this disclosure, resistances which are described as being equal are understood to be within 5 percent of each other, which will provide the advantages disclosed herein.

FIG. 1 depicts an example integrated AMR sensor. The integrated AMR sensor 100 includes a first Wheatstone bridge 102. The first Wheatstone bridge 102 includes a first resistor 104 that has a first reference direction 106. The first reference direction 106 is oriented at a first reference angle 108 with respect to a common reference axis 110 of the integrated AMR sensor 100. In the instant example, the first reference angle 108 may have a value of 45 degrees. Other values of the first reference angle 108 are within the scope of the instant example. The common reference axis 110 may be parallel to a physical structure of the integrated AMR sensor 100, for example an edge of the integrated AMR sensor 100 or an internal member of the integrated AMR sensor 100.

The first Wheatstone bridge 102 includes a second resistor 112 that has a second reference direction 114. The second reference direction 114 is oriented at a second reference angle 116 with respect to the common reference axis 110. The second reference direction 114 is perpendicular to the first reference direction 106. In the instant example, the second reference angle 116 may have a value of 135 degrees. The second resistor 112 is electrically coupled in series with the first resistor 104. The first resistor 104 and the second resistor 112 are part of a first half bridge 118 of the first Wheatstone bridge 102.

The first Wheatstone bridge 102 includes a third resistor 120 that has a third reference direction 122. The third reference direction 122 is oriented at a third reference angle 124 with respect to the common reference axis 110. The third reference direction 122 is perpendicular to the first reference direction 106. In the instant example, the third reference angle 124 may have a value of −45 degrees.

The first Wheatstone bridge 102 includes a fourth resistor 126 that has a fourth reference direction 128. The fourth reference direction 128 is oriented at a fourth reference angle 130 with respect to the common reference axis 110. The fourth reference direction 128 is perpendicular to the third reference direction 122. In the instant example, the fourth reference angle 130 may have a value of −135 degrees. The fourth resistor 126 is electrically coupled in series with the third resistor 120. The third resistor 120 and the fourth resistor 126 are part of a second half bridge 132 of the first Wheatstone bridge 102.

The first resistor 104 and the third resistor 120 are electrically coupled to a first bias terminal 134, labeled "BIAS 1" in FIG. 1, of the integrated AMR sensor 100. The second resistor 112 and the fourth resistor 126 are electrically coupled to a second bias terminal 136, labeled "BIAS 2" in FIG. 1, of the integrated AMR sensor 100. The first resistor 104 and the second resistor 112 are electrically coupled to a first sense terminal 138, labeled "SENSE 1" in FIG. 1, of the integrated AMR sensor 100. The third resistor 120 and the fourth resistor 126 are electrically coupled to a second sense terminal 140, labeled "SENSE 2" in FIG. 1, of the integrated AMR sensor 100. The first resistor 104 is electrically coupled in series between the first bias terminal 134 and the first sense terminal 138. The second resistor 112 is electrically coupled in series between the first sense terminal 138 and the second bias terminal 136. The third resistor 120 is electrically coupled in series between the first bias terminal 134 and the second sense terminal 140. The fourth resistor 126 is electrically coupled in series between the second sense terminal 140 and the second bias terminal 136. Each of the first resistor 104, the second resistor 112, the third resistor 120, and the fourth resistor 126 includes magnetoresistive segments.

The first Wheatstone bridge 102 has an orthogonal configuration. For the purposes of this disclosure, an orthogonal configuration is understood to be attained wherein the second reference direction 114 of the second resistor 112 is perpendicular to the first reference direction 106 of the first resistor 104, the third reference direction 122 of the third resistor 120 is perpendicular to the first reference direction 106, and the fourth reference direction 128 of the fourth resistor 126 is perpendicular to the third reference direction 122.

The integrated AMR sensor 100 includes a second Wheatstone bridge 142. The second Wheatstone bridge 142 includes a fifth resistor 144 that has a fifth reference direction 146. The fifth reference direction 146 is oriented at a fifth reference angle 148 with respect to the common reference axis 110. The fifth reference direction 146 is oriented at an angle of 45 degrees with respect to the first reference direction 106. In the instant example, the fifth reference angle 148 may have a value of 0 degrees.

The second Wheatstone bridge 142 includes a sixth resistor 150 that has a sixth reference direction 152. The sixth reference direction 152 is oriented at a sixth reference angle 154 with respect to the common reference axis 110. The sixth reference direction 152 is perpendicular to the fifth reference direction 146. In the instant example, the sixth reference angle 154 may have a value of 90 degrees. The sixth resistor 150 is electrically coupled in series with the fifth resistor 144. The fifth resistor 144 and the sixth resistor 150 are part of a third half bridge 156 of the second Wheatstone bridge 142.

The second Wheatstone bridge 142 includes a seventh resistor 158 that has a seventh reference direction 160. The seventh reference direction 160 is oriented at a seventh reference angle 162 with respect to the common reference axis 110. The seventh reference direction 160 is perpendicular to the fifth reference direction 146. In the instant example, the seventh reference angle 162 may have a value of −90 degrees.

The second Wheatstone bridge 142 includes an eighth resistor 164 that has an eighth reference direction 166. The eighth reference direction 166 is oriented at an eighth reference angle 168 with respect to the common reference axis 110. The eighth reference direction 166 is perpendicular to the seventh reference direction 160. In the instant example, the eighth reference angle 168 may have a value of 180 degrees. The eighth resistor 164 is electrically coupled in series with the seventh resistor 158. The seventh resistor 158 and the eighth resistor 164 are part of a fourth half bridge 170 of the second Wheatstone bridge 142.

The fifth resistor 144 and the seventh resistor 158 are electrically coupled to a third bias terminal 172, labeled "BIAS 3" in FIG. 1, of the integrated AMR sensor 100. The sixth resistor 150 and the eighth resistor 164 are electrically coupled to a fourth bias terminal 174, labeled "BIAS 4" in FIG. 1, of the integrated AMR sensor 100. The fifth resistor 144 and the sixth resistor 150 are electrically coupled to a third sense terminal 176, labeled "SENSE 3" in FIG. 1, of the integrated AMR sensor 100. The seventh resistor 158 and the eighth resistor 164 are electrically coupled to a fourth sense terminal 178, labeled "SENSE 4" in FIG. 1, of the integrated AMR sensor 100. The fifth resistor 144 is electrically coupled in series between the third bias terminal 172 and the third sense terminal 176. The sixth resistor 150 is electrically coupled in series between the third sense terminal 176 and the fourth bias terminal 174. The seventh resistor 158 is electrically coupled in series between the third bias terminal 172 and the fourth sense terminal 178. The eighth resistor 164 is electrically coupled in series between the fourth sense terminal 178 and the fourth bias terminal 174. Each of the fifth resistor 144, the sixth resistor 150, the seventh resistor 158, and the eighth resistor 164 includes magnetoresistive segments. The second Wheatstone bridge 142 also has an orthogonal configuration. The second Wheatstone bridge 142 is oriented at an angle of 45 degrees with respect to the first Wheatstone bridge 102.

During operation of the integrated AMR sensor 100, a first differential signal obtained from the first sense terminal 138 and the second sense terminal 140 may be combined with a second differential signal obtained from the third sense terminal 176 and the fourth sense terminal 178, to estimate an magnetic field angle 180 of an external magnetic field 182, depicted schematically in FIG. 1 by an arrow labeled "EXTERNAL MAGNETIC FIELD" with respect to the common reference axis 110. The magnetoresistive segments in the first resistor 104 through the eighth resistor 164 are oriented so as to advantageously cancel out angular error due to shape anisotropy in the estimate of the magnetic field angle 180. The angular error due to shape anisotropy may be less than 0.04 degrees for all values of the magnetic field angle 180, for magnitudes of the external magnetic field 182 greater than 200 oersted.

In an alternate version of the instant example, the integrated AMR sensor 100 may have only one Wheatstone bridge, for example, the first Wheatstone bridge 102. In this version, the magnetic field angle 180 may be estimated over a range of 180 degrees. In a further version of the instant example, the integrated AMR sensor 100 may have only one half bridge, for example, the first half bridge 118. In this version, the magnetic field angle 180 may be estimated over a range of 90 degrees.

Figure 2:
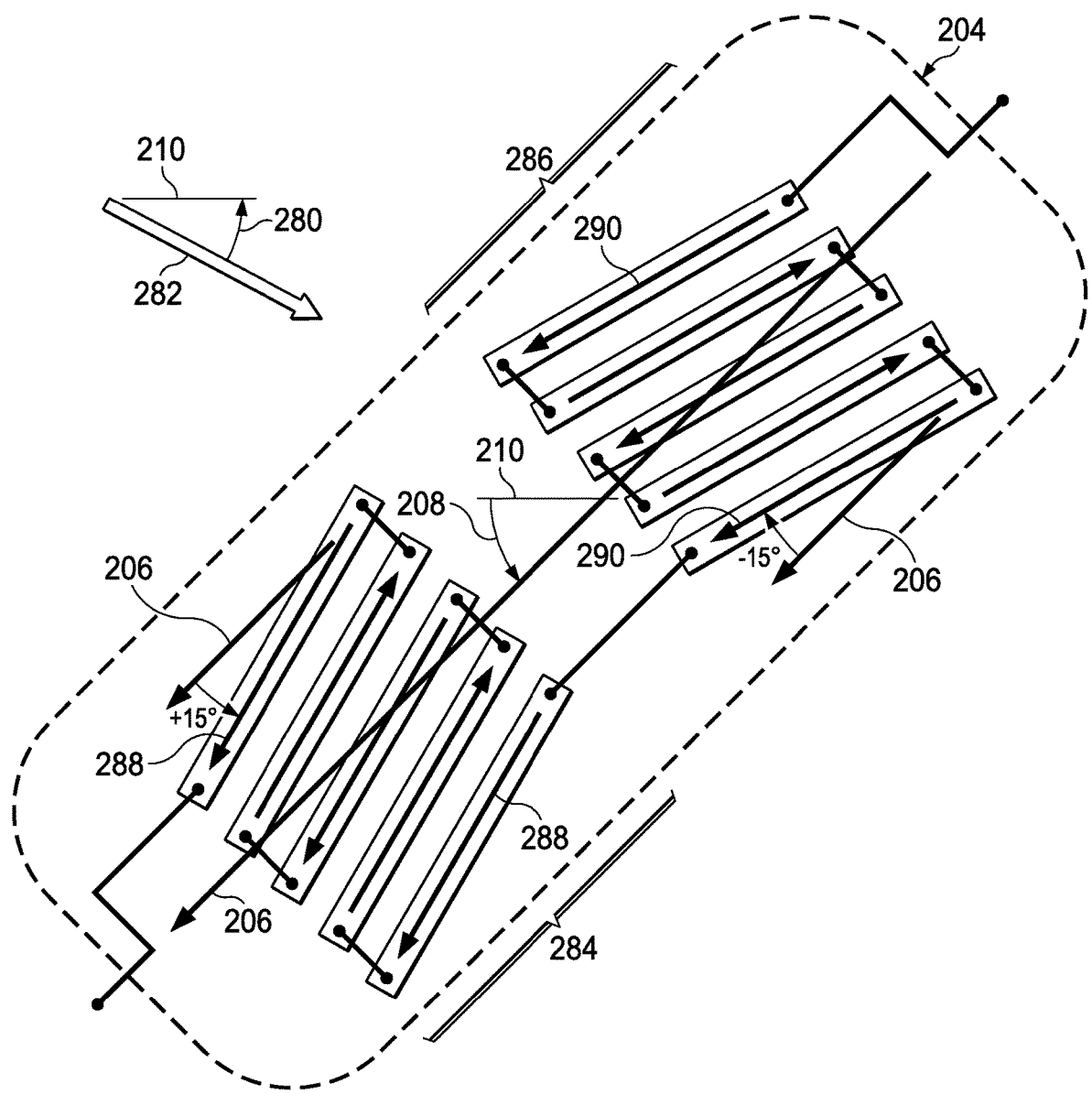
FIG. 2 is a top view of an example resistor of an integrated AMR sensor having two Wheatstone bridges as described in reference to FIG. 1.

FIG. 2 is a top view of an example resistor of an integrated AMR sensor having two Wheatstone bridges as described in reference to FIG. 1. The resistor 204 has a reference direction 206. The reference direction 206 is oriented at a reference angle 208 with respect to a common reference axis 210 of the integrated AMR sensor. The resistor 204 of the instant example includes first magnetoresistive segments 284 and second magnetoresistive segments 286, electrically coupled in series, as depicted schematically in FIG. 2. Each of the first magnetoresistive segments 284 and the second magnetoresistive segments 286 has a length which may be understood as a linear dimension parallel to a current flow direction of the first magnetoresistive segment 284 or second magnetoresistive segment 286 during operation of the integrated AMR sensor, and has a width which may be understood as an average lateral dimension of the first magnetoresistive segment 284 or second magnetoresistive segment 286, perpendicular to the length. The first magnetoresistive segments 284 and the second magnetoresistive segments 286 may have ratios of the lengths to the widths, referred to as length-to-width ratios, greater than 10, which may enable attainment of a desired total resistance of the first magnetoresistive segments 284 in a desired area, compared with a configuration of magnetoresistive segments having lower length-to-width ratios, for example less than 5. Higher length-to-width ratios advantageously reduce area required for interconnections between sequential magnetoresistive segments. The first magnetoresistive segments 284 may have equal lengths, and the second magnetoresistive segments 286 may have equal lengths, as depicted in FIG. 2. Alternatively, the first magnetoresistive segments 284 may have a range of lengths, and similarly for the second magnetoresistive segments 286.

In the instant example, a total resistance of the first magnetoresistive segments 284 and a total resistance of the second magnetoresistive segments 286 are balanced so as to cancel angular errors due to shape anisotropies. For example, the total resistance of the first magnetoresistive segments 284 may be approximately equal to the total resistance of the second magnetoresistive segments 286. In one sense, the term "approximately equal" may be understood to mean equal within a few percent. In another sense, the term "approximately equal" may be understood to mean equal within fabrication tolerances encountered during fabrication of the integrated AMR sensor. In a further sense, the term "approximately equal" may be understood to mean equal within measurement tolerances encountered during an analysis of the integrated AMR sensor. Each of the first magnetoresistive segments 284 has a first current flow direction 288 which is in a direction of current flow through the first magnetoresistive segment 284 during operation of the integrated AMR sensor. In the instant example, each first current flow direction 288 is oriented at +12 degrees to +18 degrees with respect to the reference direction 206 of the resistor 204. Similarly, each of the second magnetoresistive segments 286 has a second current flow direction 290 which is in a direction of current flow through the second magnetoresistive segment 286 during operation of the integrated AMR sensor. In the instant example, each second current flow direction 290 is oriented at −12 degrees to −18 degrees with respect to the reference direction 206 of the resistor 204. Angular error due to shape anisotropy is further reduced as the first magnetoresistive segments 284 are arranged to have each first current flow direction 288 oriented closer to +15 degrees with respect to the reference direction 206, and as the second magnetoresistive segments 286 are arranged to have each second current flow direction 290 oriented closer to −15 degrees with respect to the reference direction 206. In the instant example, each resistor of the two Wheatstone bridges of the integrated AMR sensor has a similar configuration of magnetoresistive segments. Such a magnetoresistive segment configuration in each resistor may provide an angular error due to shape anisotropy that is less than 0.04 degrees for all orientation angles 280 of an external magnetic field 282.

Figure 3:
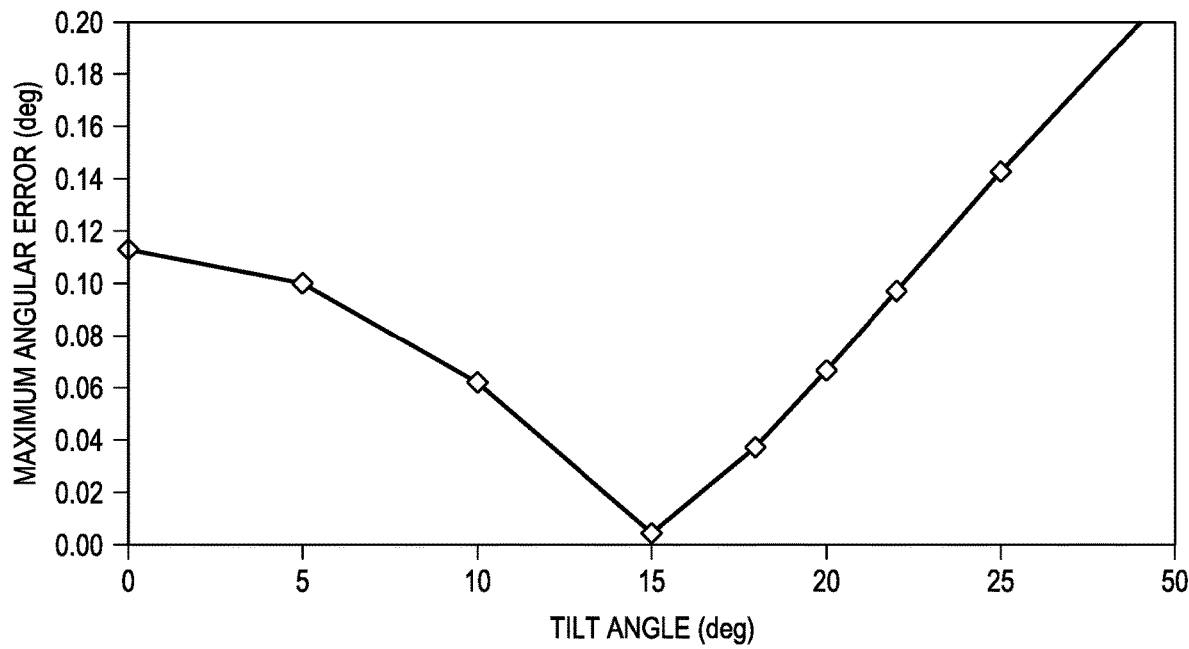
FIG. 3 is a chart of estimated maximum angular error for an integrated AMR sensor having resistors with first magnetoresistive segments and second magnetoresistive segments, each of equal total resistance.

FIG. 3 is a chart of estimated maximum angular error due to shape anisotropy for an integrated AMR sensor having resistors with first magnetoresistive segments and second magnetoresistive segments, each of equal total resistance, and free of other magnetoresistive segments. The chart of FIG. 3 depicts an estimated maximum angular error as a function of tilt angle, wherein the first magnetoresistive segments are oriented at a positive magnitude of the tilt angle with respect to a reference direction of the resistor containing the first magnetoresistive segments, and wherein the second magnetoresistive segments are oriented at a negative magnitude of the tilt angle with respect to the reference direction of the resistor. A tilt angle of +12 degrees to +18 degrees for the first magnetoresistive segments, and a tilt angle of −12 degrees to −18 degrees for the second magnetoresistive segments, for example as shown in FIG. 2, may provide a maximum angular error due to shape anisotropy less than 0.04 degrees for all orientation angles of an external magnetic field. A tilt angle closer to +15 degrees for the first magnetoresistive segments, and a tilt angle closer to −15 degrees for the second magnetoresistive segments, may provide a maximum angular error due to shape anisotropy less than 0.01 degrees for all orientation angles of an external magnetic field.

Figure 4:
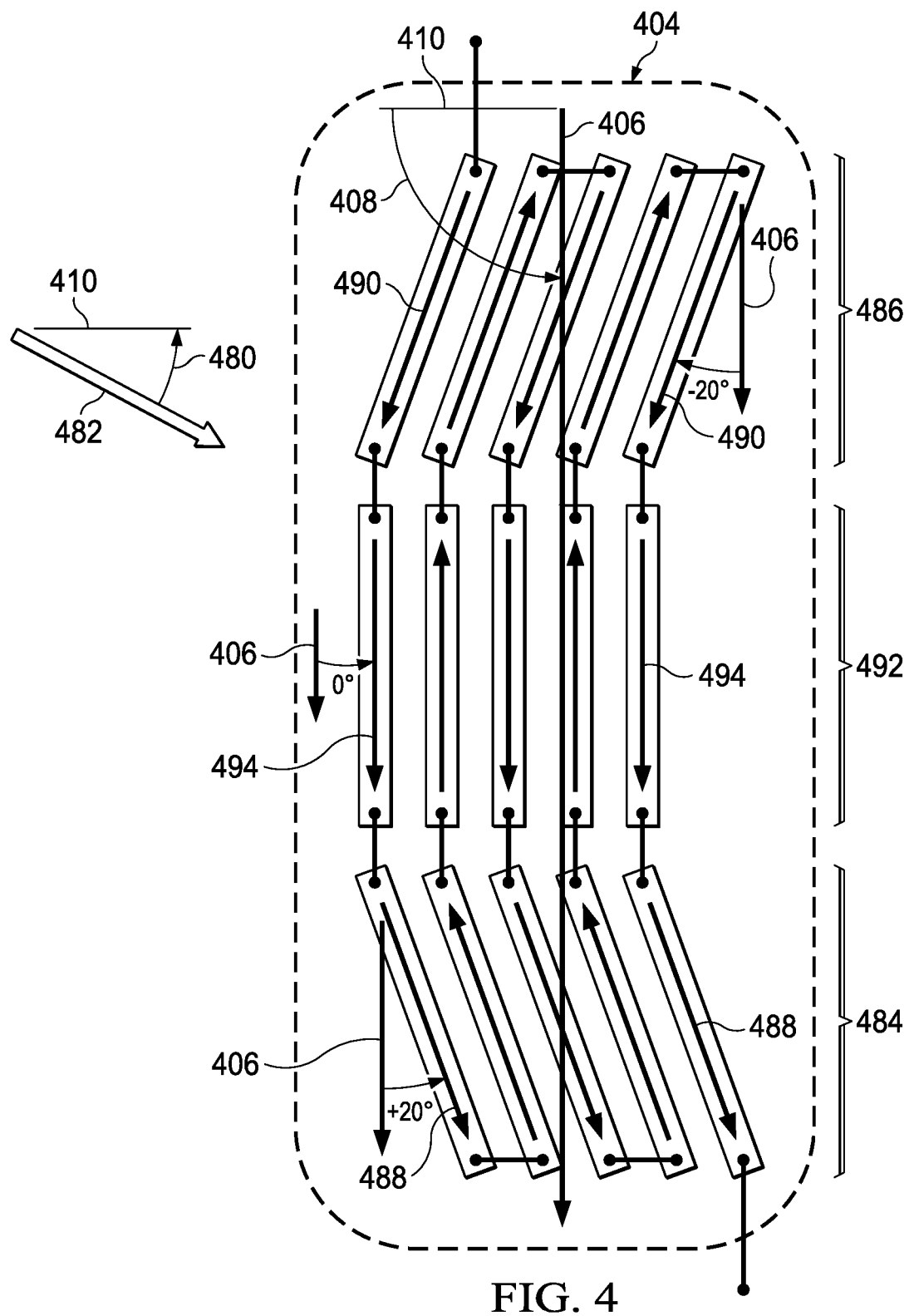
FIG. 4 is a top view of an example resistor of another integrated AMR sensor having two Wheatstone bridges as described in reference to FIG. 1.

FIG. 4 is a top view of an example resistor of another integrated AMR sensor having two Wheatstone bridges as described in reference to FIG. 1. The resistor 404 has a reference direction 406. The reference direction 406 is oriented at a reference angle 408 with respect to a common reference axis 410 of the integrated AMR sensor. The resistor 404 of the instant example includes first magnetoresistive segments 484, second magnetoresistive segments 486, and third magnetoresistive segments 492, electrically coupled in series, as depicted schematically in FIG. 4. Each of the first magnetoresistive segments 484, the second magnetoresistive segments 486, and the third magnetoresistive segments 492, has a length and a width, as described in reference to FIG. 2. The first magnetoresistive segments 484 the second magnetoresistive segments 486, and the third magnetoresistive segments 492, may have length-to-width ratios greater than 10.

In the instant example, a total resistance of the first magnetoresistive segments 484, a total resistance of the second magnetoresistive segments 486, and a total resistance of the third magnetoresistive segments 492 are balanced so as to cancel angular errors due to shape anisotropies. For example, the total resistance of the first magnetoresistive segments 484 may be approximately equal to the total resistance of the second magnetoresistive segments 486, and may be approximately equal to the total resistance of the third magnetoresistive segments 492. Each of the first magnetoresistive segments 484 has a first current flow direction 488 which is in a direction of current flow through the first magnetoresistive segment 484 during operation of the integrated AMR sensor. In the instant example, each first current flow direction 488 is oriented at +16 degrees to +24 degrees with respect to the reference direction 406 of the resistor 404. Each of the second magnetoresistive segments 486 has a second current flow direction 490 which is in a direction of current flow through the second magnetoresistive segment 486 during operation of the integrated AMR sensor. In the instant example, each second current flow direction 490 is oriented at −16 degrees to −24 degrees with respect to the reference direction 406 of the resistor 404. Each of the third magnetoresistive segments 492 has a third current flow direction 494 which is in a direction of current flow through the third magnetoresistive segment 492 during operation of the integrated AMR sensor. In the instant example, each third current flow direction 494 is oriented at 0 degrees with respect to the reference direction 406 of the resistor 404. In the instant example, each resistor of the two Wheatstone bridges of the integrated AMR sensor has a similar configuration of magnetoresistive segments. Angular error is further reduced as the first magnetoresistive segments 484 are arranged to have each first current flow direction 488 oriented closer to +20 degrees with respect to the reference direction 406, and as the second magnetoresistive segments 486 are arranged to have each second current flow direction 490 oriented closer to −20 degrees with respect to the reference direction 406. In the instant example, each resistor of the two Wheatstone bridges of the integrated AMR sensor has a similar configuration of magnetoresistive segments. Such a magnetoresistive segment configuration in each resistor may provide an angular error due to shape anisotropy that is less than 0.04 degrees for all orientation angles 480 of an external magnetic field 482.

Figure 5:
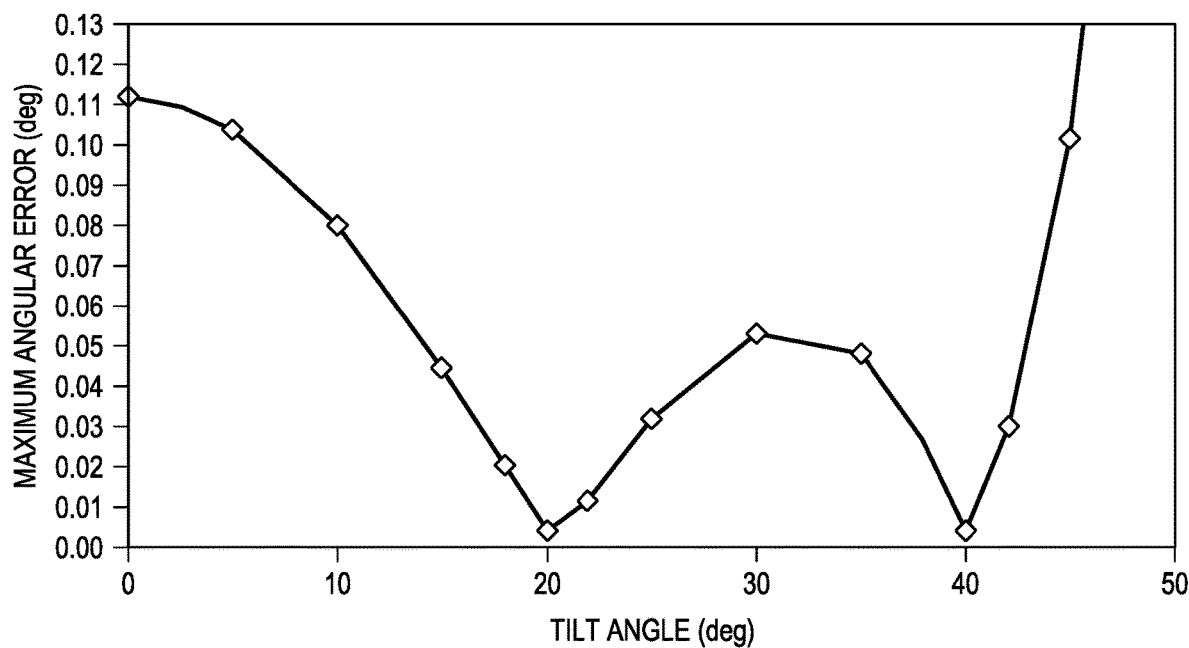
FIG. 5 is a chart of estimated maximum angular error for an integrated AMR sensor having resistors with first magnetoresistive segments, second magnetoresistive segments, and third magnetoresistive segments, each of equal total resistance.

FIG. 5 is a chart of estimated maximum angular error due to shape anisotropy for an integrated AMR sensor having resistors with first magnetoresistive segments, second magnetoresistive segments, and third magnetoresistive segments, each of equal total resistance, and free of other magnetoresistive segments. The chart of FIG. 5 depicts an estimated maximum angular error as a function of tilt angle, wherein the first magnetoresistive segments are oriented at a positive magnitude of the tilt angle with respect to a reference direction of the resistor containing the first magnetoresistive segments, and wherein the second magnetoresistive segments are oriented at a negative magnitude of the tilt angle with respect to the reference direction of the resistor, and wherein the third magnetoresistive segments are oriented at zero degrees with respect to the reference direction of the resistor. A tilt angle of +16 degrees to +24 degrees for the first magnetoresistive segments, and a tilt angle of −16 degrees to −24 degrees for the second magnetoresistive segments, for example as shown in FIG. 4, may provide a maximum angular error due to shape anisotropy that is less than 0.04 degrees for all orientation angles of an external magnetic field. A tilt angle closer to +20 degrees for the first magnetoresistive segments, and a tilt angle closer to −20 degrees for the second magnetoresistive segments, may provide a maximum angular error due to shape anisotropy less than 0.01 degrees for all orientation angles of an external magnetic field.

Figure 6:
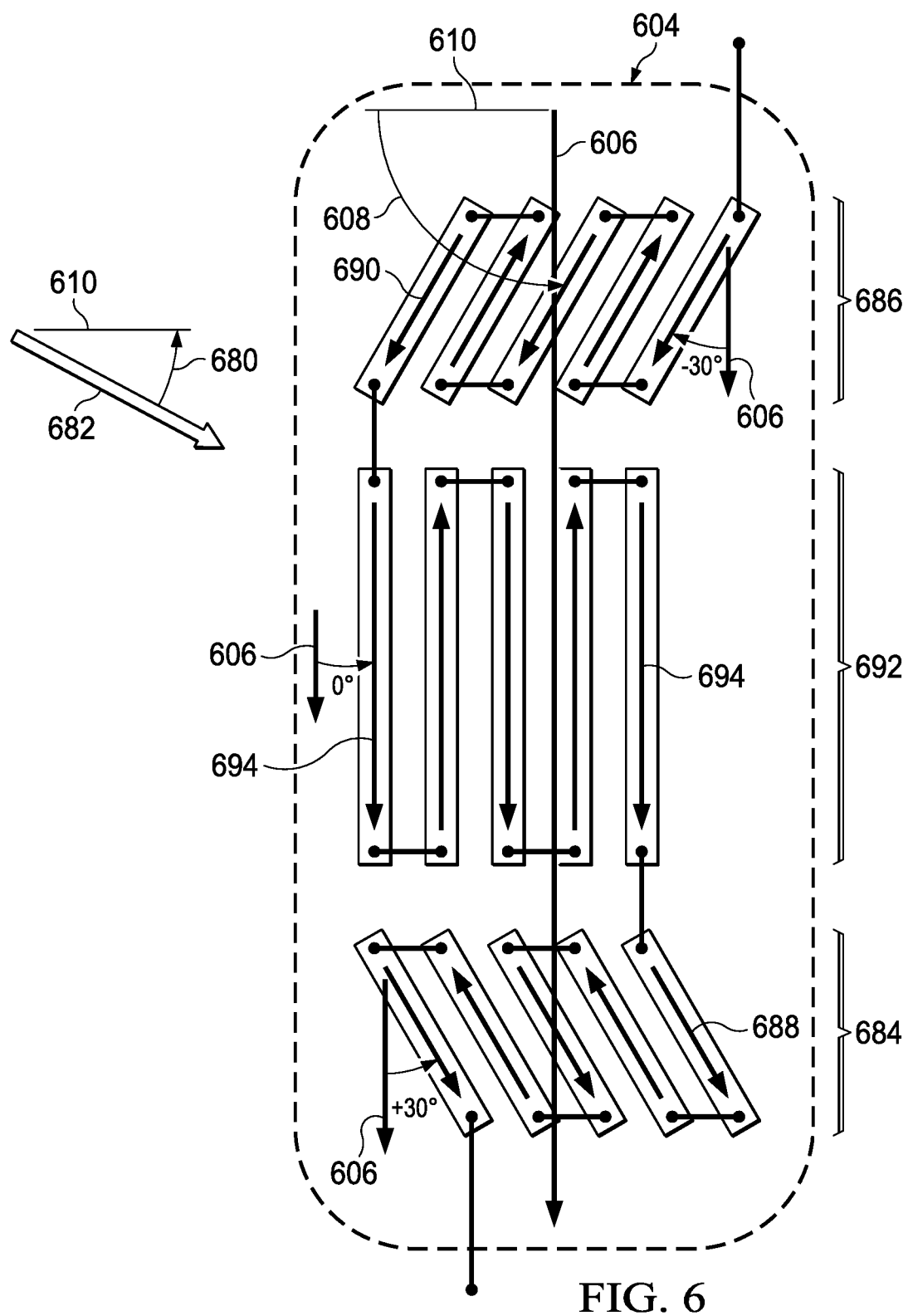
FIG. 6 is a top view of an example resistor of a further integrated AMR sensor having two Wheatstone bridges as described in reference to FIG. 1.

FIG. 6 is a top view of an example resistor of a further integrated AMR sensor having two Wheatstone bridges as described in reference to FIG. 1. The resistor 604 has a reference direction 606. The reference direction 606 is oriented at a reference angle 608 with respect to a common reference axis 610 of the integrated AMR sensor. The resistor 604 of the instant example includes first magnetoresistive segments 684, second magnetoresistive segments 686, and third magnetoresistive segments 692, electrically coupled in series, as depicted schematically in FIG. 6. Each of the first magnetoresistive segments 684, the second magnetoresistive segments 686, and the third magnetoresistive segments 692, has a length and a width, as described in reference to FIG. 2. The first magnetoresistive segments 684 the second magnetoresistive segments 686, and the third magnetoresistive segments 692, may have length-to-width ratios greater than 10.

In the instant example, a total resistance of the first magnetoresistive segments 684, a total resistance of the second magnetoresistive segments 686, and a total resistance of the third magnetoresistive segments 692 are balanced so as to cancel angular errors due to shape anisotropies. For example, the total resistance of the first magnetoresistive segments 684 may be approximately equal to the total resistance of the second magnetoresistive segments 686, and the total resistance of the third magnetoresistive segments 692 may be approximately equal to a sum of the total resistance of the first magnetoresistive segments 684 and the total resistance of the second magnetoresistive segments 686. Each of the first magnetoresistive segments 684 has a first current flow direction 688 which is in a direction of current flow through the first magnetoresistive segment 684 during operation of the integrated AMR sensor. In the instant example, each first current flow direction 688 is oriented at +24 degrees to +36 degrees with respect to the reference direction 606 of the resistor 604. Each of the second magnetoresistive segments 686 has a second current flow direction 690 which is in a direction of current flow through the second magnetoresistive segment 686 during operation of the integrated AMR sensor. In the instant example, each second current flow direction 690 is oriented at −24 degrees to −36 degrees with respect to the reference direction 606 of the resistor 604. Each of the third magnetoresistive segments 692 has a third current flow direction 694 which is in a direction of current flow through the third magnetoresistive segment 692 during operation of the integrated AMR sensor. In the instant example, each third current flow direction 694 is oriented at 0 degrees with respect to the reference direction 606 of the resistor 604. Angular error is further reduced as the first magnetoresistive segments 684 are arranged to have each first current flow direction 688 oriented closer to +30 degrees with respect to the reference direction 606, and as the second magnetoresistive segments 686 are arranged to have each second current flow direction 690 oriented closer to −30 degrees with respect to the reference direction 606. In the instant example, each resistor of the two Wheatstone bridges of the integrated AMR sensor has a similar configuration of magnetoresistive segments. Such a magnetoresistive segment configuration in each resistor may provide an angular error due to shape anisotropy less than 0.04 degrees for all orientation angles 680 of an external magnetic field 682.

Figure 7:
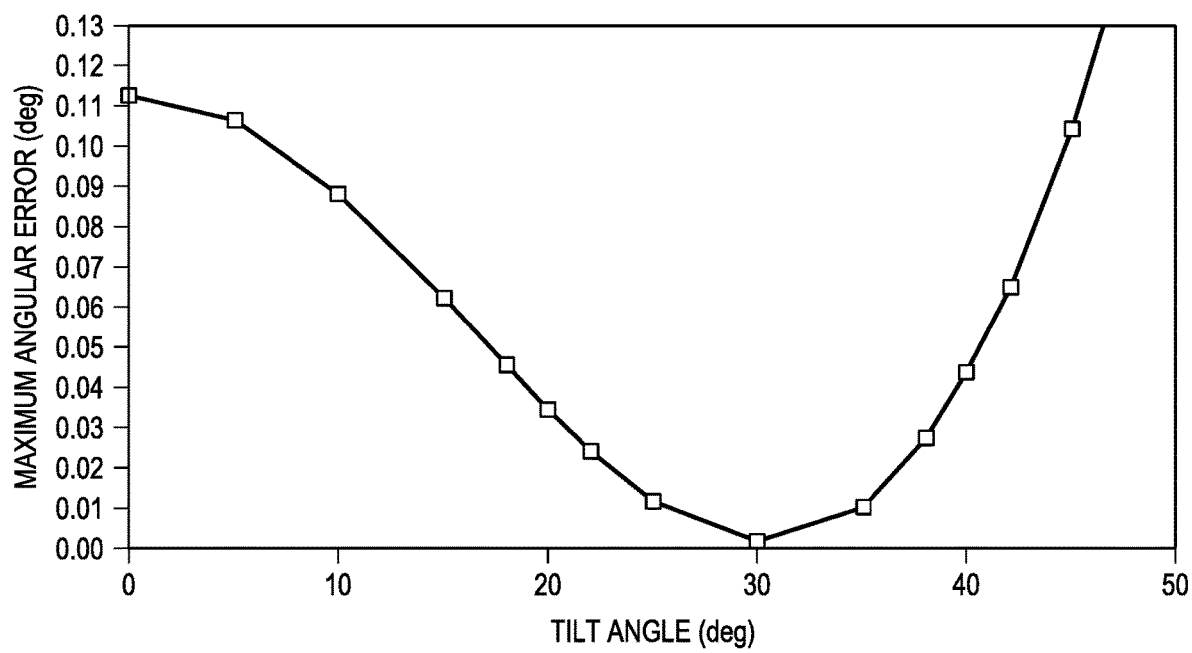
FIG. 7 is a chart of estimated maximum angular error for an integrated AMR sensor having resistors with first magnetoresistive segments, second magnetoresistive segments, and third magnetoresistive segments.

FIG. 7 is a chart of estimated maximum angular error due to shape anisotropy for an integrated AMR sensor having resistors with first magnetoresistive segments, second magnetoresistive segments, and third magnetoresistive segments. A total resistance of the first magnetoresistive segments is approximately equal to a total resistance of the second magnetoresistive segments. A total resistance of the third magnetoresistive segments is approximately equal to a sum of the total resistance of the first magnetoresistive segments and the total resistance of the second magnetoresistive segments. The chart of FIG. 7 depicts an estimated maximum angular error as a function of tilt angle, wherein the first magnetoresistive segments are oriented at a positive magnitude of the tilt angle with respect to a reference direction of the resistor containing the first magnetoresistive segments, and wherein the second magnetoresistive segments are oriented at a negative magnitude of the tilt angle with respect to the reference direction of the resistor, and wherein the third magnetoresistive segments are oriented at zero degrees with respect to the reference direction of the resistor. A tilt angle of +24 degrees to +36 degrees for the first magnetoresistive segments, and a tilt angle of −24 degrees to −36 degrees for the second magnetoresistive segments, for example as shown in FIG. 6, may provide a maximum angular error due to shape anisotropy that is less than 0.04 degrees for all orientation angles of an external magnetic field. A tilt angle closer to +30 degrees for the first magnetoresistive segments, and a tilt angle closer to −30 degrees for the second magnetoresistive segments, may provide a maximum angular error due to shape anisotropy less than 0.01 degrees for all orientation angles of an external magnetic field.

Figure 8:
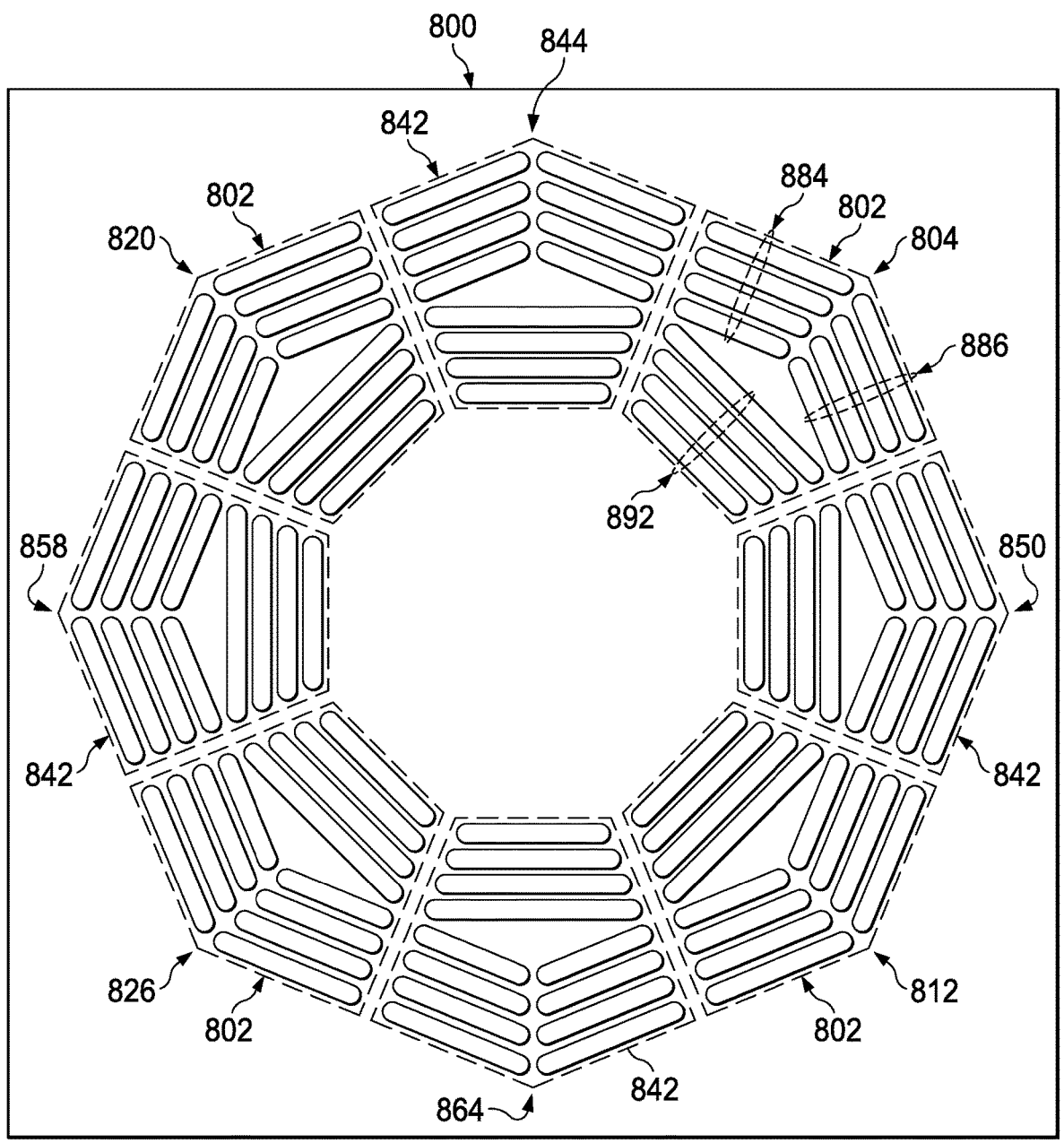
FIG. 8 is a top view of an example integrated AMR sensor.

FIG. 8 is a top view of an example integrated AMR sensor. The integrated AMR sensor 800 includes a first Wheatstone bridge 802 having a first resistor 804, a second resistor 812, a third resistor 820, and a fourth resistor 826, arranged in an orthogonal configuration. The integrated AMR sensor 800 further includes a second Wheatstone bridge 842 having a fifth resistor 844, a sixth resistor 850, a seventh resistor 858, and an eighth resistor 864, arranged in an orthogonal configuration and oriented at 45 degrees with respect to the first Wheatstone bridge 802.

Each of the first resistor 804, the second resistor 812, the third resistor 820, the fourth resistor 826, the fifth resistor 844, the sixth resistor 850, the seventh resistor 858, and the eighth resistor 864 includes at least first magnetoresistive segments 884 oriented at a first tilt angle with respect to a reference direction of the instant resistor 804, 812, 820, 826, 844, 850, 858, or 864, and second magnetoresistive segments 886 oriented at a second tilt angle with respect to the reference direction of the instant resistor 804, 812, 820, 826, 844, 850, 858, or 864. Each resistor 804, 812, 820, 826, 844, 850, 858, and 864 may further include third magnetoresistive segments 892 oriented at a tilt angle of zero degrees with respect to the reference direction of the instant resistor 804, 812, 820, 826, 844, 850, 858, or 864. In each resistor 804, 812, 820, 826, 844, 850, 858, and 864, the first magnetoresistive segments 884, the second magnetoresistive segments 886 and the third magnetoresistive segments 892 are electrically coupled in series.

The first magnetoresistive segments 884 in each resistor 804, 812, 820, 826, 844, 850, 858, and 864 may have varying lengths, as depicted in FIG. 8. Similarly, the second magnetoresistive segments 886 in each resistor 804, 812, 820, 826, 844, 850, 858, and 864 may also have varying lengths. The third magnetoresistive segments 892, if present, in each resistor 804, 812, 820, 826, 844, 850, 858, and 864 may have varying lengths. Varying lengths of the first magnetoresistive segments 884, the second magnetoresistive segments 886, and the third magnetoresistive segments 892 may enable an efficient layout wherein the first Wheatstone bridge 802 and the second Wheatstone bridge 842 are arranged around a central region, which may advantageously reduce measurement errors due to non-uniform external magnetic fields.

Figure 9:
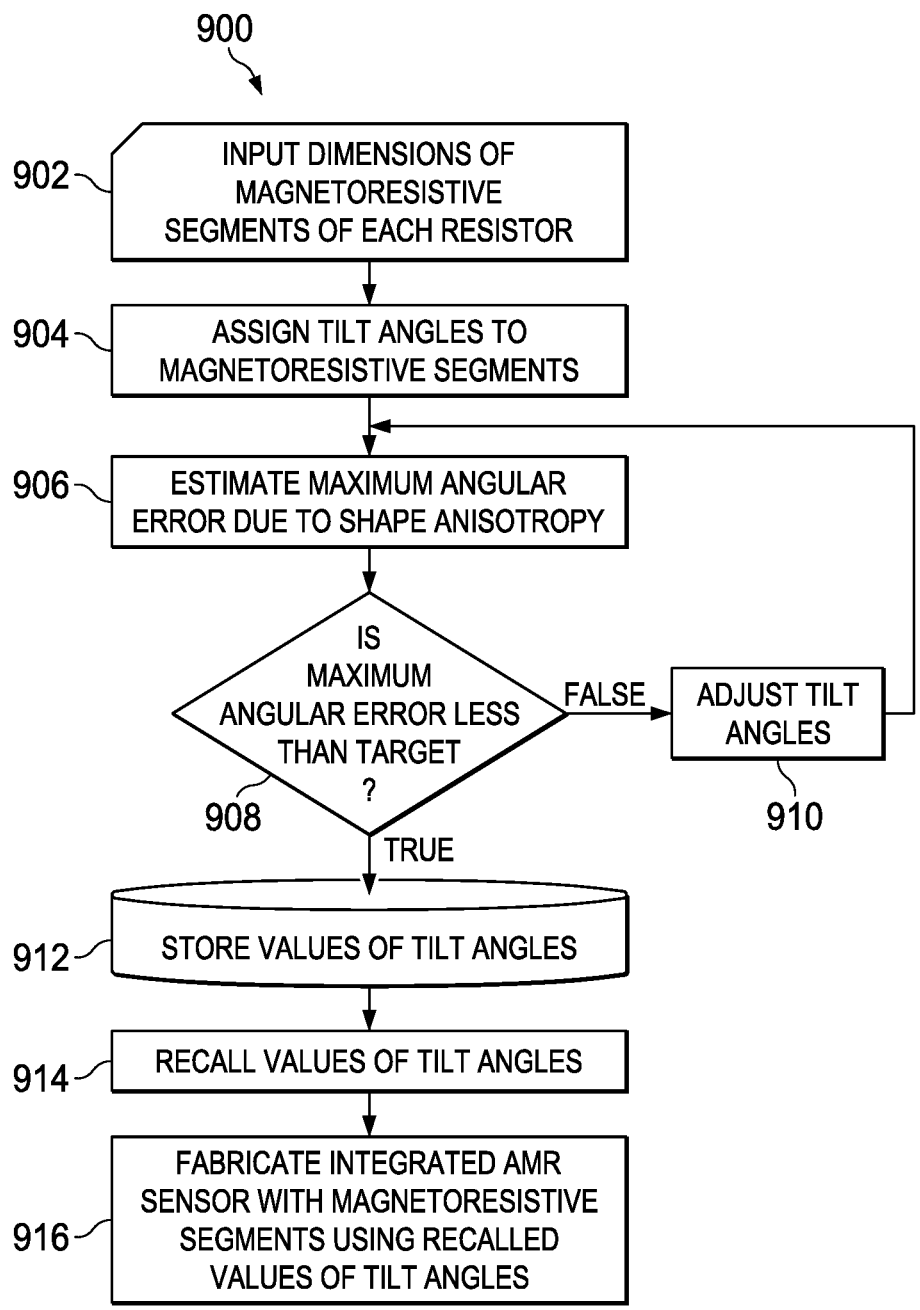
FIG. 9 is a flowchart of an example method of forming an integrated AMR sensor.

FIG. 9 is a flowchart of an example method of forming an integrated AMR sensor. The integrated AMR sensor may have the configuration disclosed in reference to FIG. 1. Some steps of the method of forming the integrated AMR sensor 900 may be implemented on a digital computer or other calculating device. Some steps may be implemented without aid of electronic tools, for example, using calculations on paper. Some steps may be implemented using microelectronic fabrication equipment, for example in a semiconductor fabrication line. The steps disclosed for the method 900 may be implemented in another order than the order shown in FIG. 9.

Step 902 includes inputting dimensions of magnetoresistive segments of resistors for the integrated AMR sensor. For a magnetoresistive segment having a rectangular prismatic shape, the dimensions may include a length that extends in a direction of current flow through the magnetoresistive segment, a width that extends laterally perpendicular to the length, and a thickness that extends in a vertical direction, perpendicular to the length and the width. For a magnetoresistive segment having an elliptical cylindrical shape, the dimensions may include a major axis that extends in a direction of current flow through the magnetoresistive segment, a minor axis that extends laterally perpendicular to the length, and a thickness that extends in a vertical direction, perpendicular to the length and the width. For a magnetoresistive segment having another shape, the dimensions may be selected to provide a calculation of an angular error due to shape anisotropy in a subsequent step. The dimensions of the magnetoresistive segments of resistors may be selected to satisfy several criteria, for example, providing sufficient signal for an expected external magnetic field above a noise level of a detection circuit of the integrated AMR sensor, compatibility with thin film processes used in a fabrication facility making the integrated AMR sensor, and compatibility with thin photolithographic processes and etch processes used in the fabrication facility making the integrated AMR sensor. The criterion of providing sufficient signal may be advanced by reducing widths of the magnetoresistive segments, while the criterion of compatibility with thin photolithographic processes and etch processes may be advanced by increasing the widths.

Step 904 includes assigning tilt angles to each of the magnetoresistive segments. For each magnetoresistive segment, the tilt angle may describe an angle of the length of the magnetoresistive segment with respect to a reference angles of the resistor containing the magnetoresistive segment.

Step 906 includes estimating an angular error due to shape anisotropy of a measurement of an external magnetic field by the integrated AMR sensor having the magnetoresistive segments with the dimensions and tilt angles provides by steps 902 and 904. In one implementation of step 906, a demagnetization factor N for each magnetoresistive segment may be estimated as minimizing an energy of the magnetoresistive segment expressed as $$E = (\tfrac{1}{2})\mu_o M \cdot [N] M - \mu_o M \cdot H$$

wherein:

$\mu_o$ is the magnetic permittivity of free space

E is the energy of the magnetoresistive segment

M is the magnetization vector of the magnetoresistive segment

[N] is a diagonal demagnetization matrix with elements characteristic of the dimensions of the magnetoresistive segment, H is the external magnetic field, expressed as a vector, and the operator "·" indicates an inner product of vectors, producing a scalar quantity; the inner product is sometimes referred to as the "dot product."

In one implementation of step 906, elements of the diagonal demagnetization matrix [N] may be estimated using a method described by Aharoni "Demagnetizing factors for rectangular ferromagnetic prisms" J. Appl. Phys. 83, 3432 1998. In another implementation, elements of the diagonal demagnetization matrix [N] may be estimated using a finite element analysis method or other materials modeling method using a digital computer. In a further implementation of step 906, the orientation of the magnetization vector M for each magnetoresistive segment may be estimated using a computer program which models material properties.

A resistance of the magnetoresistive segment is estimated as a function of an angle, θ, between the magnetization vector M and a current flow direction along the length of the magnetoresistive segment, as:

$$R = R\perp + (R_\parallel - R\perp)\cos^2 \theta$$

wherein:

R is the resistance of the magnetoresistive segment, $R\perp$ is the resistance of the magnetoresistive segment when M is perpendicular to the current flow direction, and $R_\parallel$ is the resistance of the magnetoresistive segment when M is parallel to the current flow direction.

A resistance of each resistor of the integrated AMR sensor may include a sum of the estimated resistances of the magnetoresistive segment in the resistor. For implementations of the integrated AMR sensor containing two Wheatstone bridges, as described in reference to FIG. 1, a signal of each Wheatstone bridge may be estimated as a difference between potentials at sense terminals of the Wheatstone bridge when biases are applied to bias terminals of the Wheatstone bridge. The signals of the Wheatstone bridges may be combined, for example using an arctangent function, to estimate an orientation of the external magnetic field. An angular error due to shape anisotropy may be estimated as a difference between the orientation of the external magnetic field and the estimated orientation of the external magnetic field from the integrated AMR sensor. The angular error due to shape anisotropy is estimated for multiple orientations of the external magnetic field covering a range of orientations expected to be expected during operation of the integrated AMR sensor, for example, from zero to 360 degrees.

Step 908 is a decision step that includes comparing a maximum of the estimated angular errors due to shape anisotropy from step 906 to a target value, for example, 0.04 degrees. If the maximum estimated angular error is not less than the target value, the branch labeled "FALSE" in FIG. 9 may optionally be taken to step 910. Alternatively, if the maximum estimated angular error is not less than the target value, the method 900 may be started over, for example at step 904. If the maximum estimated angular error is less than the target value, the branch labeled "TRUE" in FIG. 9 is taken to step 912.

Step 910 includes adjusting the values of the tilt angles of the magnetoresistive segments to provide a reduced maximum estimated angular error. In one implementation of step 910, adjustments to the tilt angle values may be affected by results from step 906. In another implementation, the adjustments to the tilt angle values may be selected from a predetermined set of values, for example, a set of values spanning a range of tilt angles. Subsequent iterations through step 910 may implement both implementations. Following adjusting the tilt angle values, the method 900 proceeds back to step 906 to estimating an angular error using the adjusted tilt angle values.

Step 912 includes optionally storing the values of the tilt angles that correspond to the maximum estimated angular error less than the target value. The tilt angle values may be stored, for example, in a computer-readable medium, such as a dynamic random access memory (DRAM), a static random access memory (SRAM), a non-volatile memory such as a flash memory, ferroelectric random access memory (FRAM), or magnetoresistive random access memory (MRAM), a magnetic disk sometimes referred to as a hard disk or hard drive, a removable magnetic diskette sometimes referred to as a floppy diskette, a magnetic tape, or an optical recordable memory medium such as a recordable compact disk (CD-R) or recordable digital video disk (DVD-R). Alternatively, the tilt angle values may be stored in a non-electronic medium, such as printed paper.

Following step 912, step 914 includes recalling the tilt angle values stored in step 912. The tilt angle values may be recalled by a different system than that used to store the tilt angle values in step 912. The recalled tilt angle values may be transferred to another storage medium, or may be used immediately in a subsequent step of the method 900.

Step 916 includes fabricating the integrated AMR sensor using the recalled tilt angle values. The integrated AMR sensor is formed by forming a first resistor having a first reference direction with first magnetoresistive segments having first current flow directions oriented at a first tilt angle to the first reference direction and second magnetoresistive segments having second current flow directions oriented at a second tilt angle to the first reference direction, and forming a second resistor having a second reference direction perpendicular to the first reference direction with first magnetoresistive segments having first current flow directions oriented at the first tilt angle to the second reference direction and second magnetoresistive segments having second current flow directions oriented at the second tilt angle to the second reference direction.

In one implementation of step 916, the recalled tilt angle values may be used to form photomasks, which may be subsequently used to define etch masks over layers of magnetoresistive material, to subsequently form the magnetoresistive segments. In such an implementation, the tilt angle values may be subject to a further criterion of compatibility with photomask fabrication equipment and processes; angular resolution of the photomask fabrication equipment and processes may be limited.

In another implementation, the recalled tilt angle values may be used in a maskless lithography process such as electron beam lithography to define the etch masks. In a further implementation, the recalled tilt angle values may be used to form the magnetoresistive segments directly by an additive process such as three dimensional (3D) printing. In such an implementation, the tilt angle values may be subject to a further criterion of compatibility with the maskless lithography process or the 3D printing process.

A plurality of integrated AMR sensors may be formed as part of execution of step 916. For example, multiple instances of the integrated AMR sensors may be fabricated on a single semiconductor wafer, and multiple such wafers may be fabricated as a group, or lot, in a microelectronics fabrication facility.

It should be appreciated that the present disclosure may be implemented in numerous ways, including as a process, an apparatus, a system, a device, program instructions in a computer readable medium, or a method. While various embodiments of the present disclosure have been described above, it should be understood that they have been presented by way of example only and not limitation. Numerous changes to the disclosed embodiments can be made in accordance with the disclosure herein without departing from the spirit or scope of the disclosure. Thus, the breadth and scope of the present invention should not be limited by any of the above described embodiments. Rather, the scope of the disclosure should be defined in accordance with the following claims and their equivalents.

What is claimed is:

1. An integrated anisotropic magnetoresistive (AMR) sensor, comprising:
    a first resistor having a first reference direction; the first resistor comprising first magnetoresistive segments each having a first current flow direction oriented at a first tilt angle to the first reference direction, and second magnetoresistive segments each having a second current flow direction oriented at a second tilt angle to the first reference direction;
    a second resistor having a second reference direction perpendicular to the first reference direction, the second resistor comprising first magnetoresistive segments each having a first current flow direction oriented at the first tilt angle to the second reference direction, and second magnetoresistive segments each having a second current flow direction oriented at the second tilt angle to the second reference direction; and
    a connection between the first magnetoresistive segments of the first resistor and the second magnetoresistive segments of the first resistor, wherein the connection does not include a set of magnetoresistive segments;
    wherein the first tilt angle has a positive value, and the second tilt angle has a negative value, wherein angular errors of the integrated AMR sensor due to shape anisotropies are canceled.

2. The integrated AMR sensor of claim 1, wherein:
the first resistor is electrically coupled in series between a first bias terminal and a sense terminal; and
the second resistor is electrically coupled in series between the sense terminal and a second bias terminal.

3. The integrated AMR sensor of claim 1, further comprising:
a third resistor having a third reference direction perpendicular to the first reference direction, the third resistor comprising first magnetoresistive segments each having a first current flow direction oriented at the first tilt angle to the third reference direction, and second magnetoresistive segments each having a second current flow direction oriented at the second tilt angle to the third reference direction; and
a fourth resistor having a fourth reference direction perpendicular to the third reference direction, the fourth resistor comprising first magnetoresistive segments each having a first current flow direction oriented at the first tilt angle to the fourth reference direction, and second magnetoresistive segments each having a second current flow direction oriented at the second tilt angle to the fourth reference direction.

4. The integrated AMR sensor of claim 3, wherein:
the first resistor is electrically coupled in series between a first bias terminal and a first sense terminal;
the second resistor is electrically coupled in series between the first sense terminal and a second bias terminal;
the third resistor is electrically coupled in series between the first bias terminal and a second sense terminal; and
the fourth resistor is electrically coupled in series between the second sense terminal and the second bias terminal.

5. The integrated AMR sensor of claim 3, further comprising:
a fifth resistor having a fifth reference direction oriented at 45 degrees with respect to the first reference direction, the fifth resistor comprising first magnetoresistive segments each having a first current flow direction oriented at the first tilt angle to the fifth reference direction, and second magnetoresistive segments each having a second current flow direction oriented at the second tilt angle to the fifth reference direction;
a sixth resistor having a sixth reference direction perpendicular to the fifth reference direction, the sixth resistor comprising first magnetoresistive segments each having a first current flow direction oriented at the first tilt angle to the sixth reference direction, and second magnetoresistive segments each having a second current flow direction oriented at the second tilt angle to the sixth reference direction;
a seventh resistor having a seventh reference direction perpendicular to the fifth reference direction, the seventh resistor comprising first magnetoresistive segments each having a first current flow direction oriented at the first tilt angle to the seventh reference direction, and second magnetoresistive segments each having a second current flow direction oriented at the second tilt angle to the seventh reference direction; and
an eighth resistor having an eighth reference direction perpendicular to the seventh reference direction, the eighth resistor comprising first magnetoresistive segments each having a first current flow direction oriented at the first tilt angle to the eighth reference direction, and second magnetoresistive segments each having a second current flow direction oriented at the second tilt angle to the eighth reference direction.

6. The integrated AMR sensor of claim 5, wherein:
the first resistor is electrically coupled in series between a first bias terminal and a first sense terminal;
the second resistor is electrically coupled in series between the first sense terminal and a second bias terminal;
the third resistor is electrically coupled in series between the first bias terminal and a second sense terminal;
the fourth resistor is electrically coupled in series between the second sense terminal and the second bias terminal;
the fifth resistor is electrically coupled in series between a third bias terminal and a third sense terminal;
the sixth resistor is electrically coupled in series between the third sense terminal and a fourth bias terminal;
the seventh resistor is electrically coupled in series between the third bias terminal and a fourth sense terminal; and
the eighth resistor is electrically coupled in series between the fourth sense terminal and the fourth bias terminal.

7. The integrated AMR sensor of claim 1, wherein an estimated maximum angular error of the integrated AMR sensor due to shape anisotropy is less than 0.04 degrees.

8. The integrated AMR sensor of claim 1, wherein a magnitude of the first tilt angle is equal to a magnitude of the second tilt angle.

9. The integrated AMR sensor of claim 1, wherein the first magnetoresistive segments have equal lengths parallel to the first current flow directions, and the second magnetoresistive segments have equal lengths parallel to the second current flow directions.

10. The integrated AMR sensor of claim 1, wherein:
the first magnetoresistive segments have first lengths parallel to the first current flow directions, and first widths that are laterally perpendicular to the first lengths, and wherein a ratio of the first length to the first width for each of the first magnetoresistive segments is greater than 10; and
the second magnetoresistive segments have second lengths parallel to the second current flow directions, and second widths that are laterally perpendicular to the second lengths, and wherein a ratio of the second length to the second width for each of the second magnetoresistive segments is greater than 10.

11. An integrated anisotropic magnetoresistive (AMR) sensor, comprising:
a first resistor having a first reference direction; the first resistor comprising first magnetoresistive segments each having a first current flow direction oriented at a first tilt angle to the first reference direction, and second magnetoresistive segments each having a second current flow direction oriented at a second tilt angle to the first reference direction; and
a second resistor having a second reference direction perpendicular to the first reference direction, the second resistor comprising first magnetoresistive segments each having a first current flow direction oriented at the first tilt angle to the second reference direction, and second magnetoresistive segments each having a second current flow direction oriented at the second tilt angle to the second reference direction;
wherein the first tilt angle has a positive value, and the second tilt angle has a negative value, wherein angular errors of the integrated AMR sensor due to shape anisotropies are canceled, wherein:
the first tilt angle has a value of +12 degrees to +18 degrees;

the second tilt angle has a value of −12 degrees to −18 degrees;

each of the first resistor and the second resistor is free of additional magnetoresistive segments besides the first magnetoresistive segments and the second magnetoresistive segments; and a total resistance of the first magnetoresistive segments and a total resistance of the second magnetoresistive segments are balanced to cancel angular errors of the integrated AMR sensor due to shape anisotropies.

12. An integrated anisotropic magnetoresistive (AMR) sensor, comprising:

a first resistor having a first reference direction; the first resistor comprising first magnetoresistive segments each having a first current flow direction oriented at a first tilt angle to the first reference direction, and second magnetoresistive segments each having a second current flow direction oriented at a second tilt angle to the first reference direction; and a second resistor having a second reference direction perpendicular to the first reference direction, the second resistor comprising first magnetoresistive segments each having a first current flow direction oriented at the first tilt angle to the second reference direction, and second magnetoresistive segments each having a second current flow direction oriented at the second tilt angle to the second reference direction;

wherein the first tilt angle has a positive value, and the second tilt angle has a negative value, wherein angular errors of the integrated AMR sensor due to shape anisotropies are canceled, wherein:

the first resistor comprises third magnetoresistive segments each having a third current flow direction oriented at zero degrees to the first reference direction, wherein, in the first resistor, a top one of the first magnetoresistive segments is connected to a top one of the third magnetoresistive segments, a top one of the second magnetoresistive segments is connected to the top one of the third magnetoresistive segments, a bottom one of the first magnetoresistive segments is connected to a bottom one of the third magnetoresistive segments, and a bottom one of the second magnetoresistive segments is connected to the bottom one of the third magnetoresistive segments;

the second resistor comprises third magnetoresistive segments each having a third current flow direction oriented at zero degrees to the second reference direction;

the first tilt angle has a value of +16 degrees to +24 degrees;

the second tilt angle has a value of 16 degrees to −24 degrees;

each of the first resistor and the second resistor is free of additional magnetoresistive segments besides the first magnetoresistive segments, the second magnetoresistive segments, and the third magnetoresistive segments; and a total resistance of the first magnetoresistive segments, a total resistance of the second magnetoresistive segments, and a total resistance of the third magnetoresistive segments are balanced to cancel angular errors of the integrated AMR sensor due to shape anisotropies.

* * * * *